United States Patent [19]

Dathe

[11] Patent Number: 4,717,617

[45] Date of Patent: Jan. 5, 1988

[54] METHOD FOR THE PASSIVATION OF SILICON COMPONENTS

[75] Inventor: Joachim Dathe, Munich, Fed. Rep. of Germany

[73] Assignee: Siemens Aktiengesellschaft, Berlin and Munich, Fed. Rep. of Germany

[21] Appl. No.: 433,680

[22] Filed: Oct. 12, 1982

Related U.S. Application Data

[63] Continuation of Ser. No. 259,822, May 4, 1981, abandoned.

[30] Foreign Application Priority Data

Jun. 4, 1980 [DE] Fed. Rep. of Germany ....... 3021175

[51] Int. Cl.⁴ .............................................. H01L 21/28
[52] U.S. Cl. ...................................... 428/209; 357/52; 357/67; 428/450
[58] Field of Search ...................... 427/88, 90; 357/52, 357/67; 428/209, 450

[56] References Cited

U.S. PATENT DOCUMENTS 3,740,835 6/1973 Duncan ................................. 29/578
3,881,971 5/1975 Greer .
3,918,149 11/1975 Roberts ................................. 29/580

OTHER PUBLICATIONS

Aoki et al., "'SIPOS'—A New Technology for Silicon Surface Passivation", JEE, No. 109, pp. 44-48, Jan. 1976.

Primary Examiner—John D. Smith
Attorney, Agent, or Firm—Herbert L. Lerner; Laurence A. Greenberg

[57] ABSTRACT

Passivation of aluminum-metallized silicon components by applying at least one silicon layer. For the purpose of the subsequent contacting, the components are annealed after the application of the silicon layer at a temperature from 480° to 570° C. if the silicon layer thickness exceeds 0.1 μm and a temperature from 400° to 500° C. if the silicon layer is up to about 0.1 μm thick, it being possible to omit the annealing operation if the silicon layer thickness is less than about 0.05 μm.

4 Claims, 3 Drawing Figures

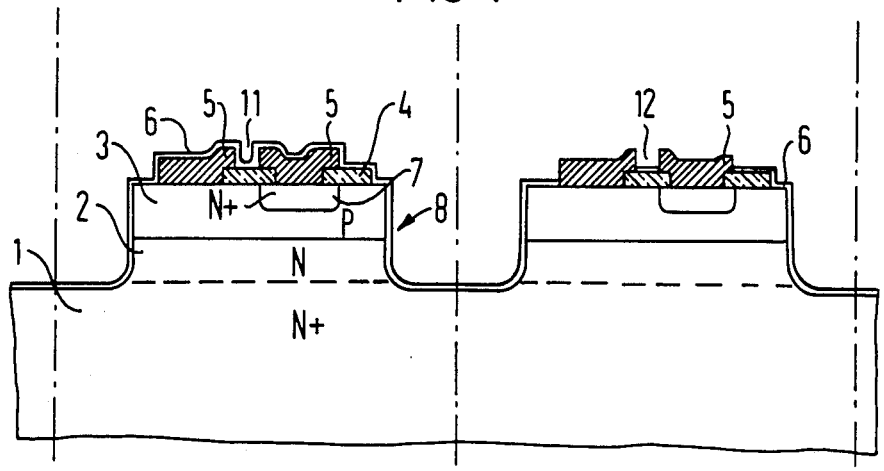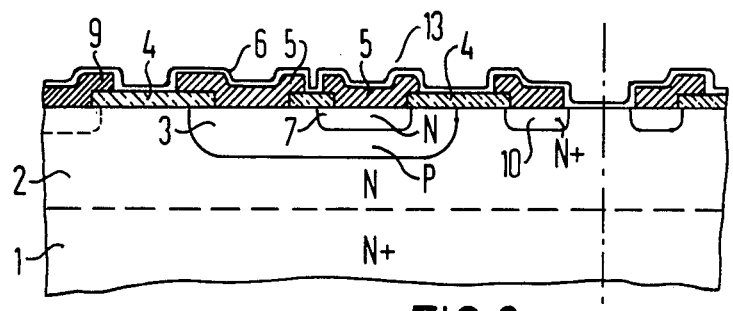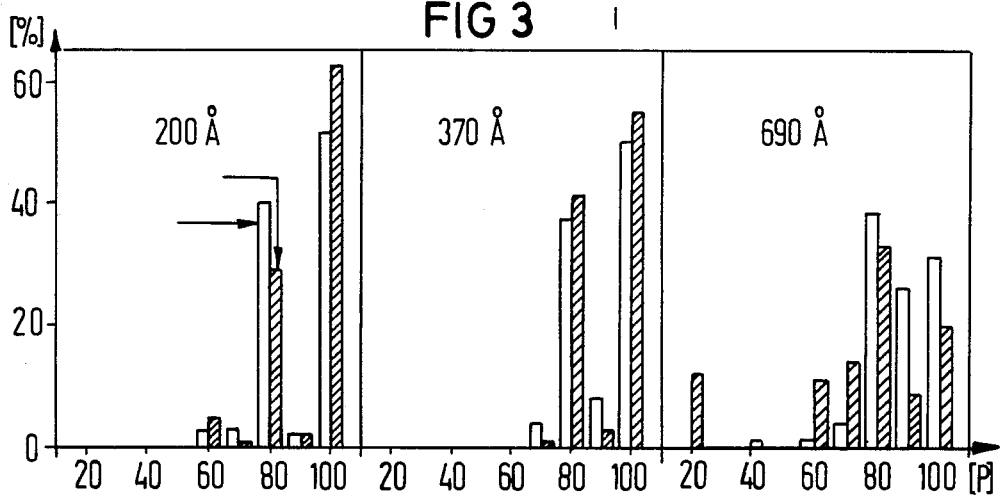

METHOD FOR THE PASSIVATION OF SILICON COMPONENTS

This is a continuation of application Ser. No. 259,822, filed May 4, 1981, now abandoned.

BACKGROUND OF THE INVENTION

1. Field of the Invention

The invention relates to a method for the passivation of silicon components provided with aluminum metallization, by applying at least one silicon layer.

2. Description of the Prior Art

It is known to passivate the surface of semiconductor components for the stabilization of current/voltage characteristics by applying various organic or inorganic cover films. By means of such cover films which may consist of paints, rubbers, or glasses, for example, it is generally possible to obtain characteristics of sufficient stability. At times, however, instabilities occur, the causes of which can be traced to changes in the properties of the cover films and/or of the component surface and which can lead to serious variations in the yield of usable components.

A method to passivate a semiconductor element by having a silicon layer grow on it thermally has been described. This method, however, is relatively time-comsuming and costly. It also requires high temperatures.

From German Published Non-Prosecuted Application DE-OS No. 26 32 647 is known a passivating method in which the protective layer consists of vapor-deposited silicon. This results in stable characteristics at considerably less expense. In addition, it is known from German Published Non-Prosecuted Application DE-OS No. 27 30 367 that, in the case of passivation by means of a vapor-deposited silicon film, the cut-off current in the cut-off direction and the reverse current in conduction direction of a semiconductor component can be lowered drastically by an annealing operation. Particularly good results are achievable when tempering takes place in an atmosphere containing oxygen.

The passivating method known from German DE-OS No. 26 32 647 and German DE-OS No. 27 30 367 is commonly called the EPOS (Evaporated Polysilicon on Surface) method. Therefore, a polycrystalline silicon layer vapor-deposited by this method is hereinafter called "EPOS" for short.

If such a silicon layer is vapor-deposited on a silicon wafer already provided with a metallization, it requires technological measures to remove the vapor-deposited silicon from the contact areas of the components or make them contactable. This is usually accomplished by protecting the contact areas of the components to be vapor-deposited by masking such as by means of photoresist or a perforated mask (shadow mask) or if the EPOS film is removed from the contact areas after the vapor-deposition by selective etching. However, appropriate measures are not without problems. Production engineering-wise, the selective etching of the photoresist-masked passivation film in particular is of significance. But due to masking problems at mesial edges and due to the attach on the metal surface, the passivation or the subsequent contact-making ability can be disturbed considerably.

These problems can be avoided if chips already soldered and contacted are passivated so that no masking or selective etching is required. But such a procedure is relatively expensive, especially for small chip sizes. Also, the passivation can be influenced by masking effects caused by the contact wires.

SUMMARY OF THE INVENTION

An object of the invention is to provide a low-cost method for the passivation of silicon components with an aluminum metallization by the application of at least one silicon layer, which method requires no technological measures to free the contact areas of the components of silicon or make them contactable.

With the foregoing and other objects in view, there is provided in accordance with the invention, a method for the passivation of aluminum-metallized silicon components which comprises applying a silicon layer on an aluminum-metallized silicon component without masking, annealing said component after the application of the silicon layer at a temperature from 480° to 570° C. if the silicon layer thickness exceeds about 0.1 μm and at a temperature from 400° to 500° C. if the silicon layer is up to about 0.1 μm thick to diffuse the silicon layer on the aluminum surface of the component into the aluminum to provide a contactable surface without etching to remove the silicon layer.

Other features which are considered as characteristic for the invention are set forth in the appended claims.

Although the invention is illustrated and described herein as embodied in a method for the passivation of silicon components, it is nevertheless not intended to be limited to the details shown, since various modifications may be made therein without departing from the spirit of the invention and within the scope and range of equivalents of the claims.

BRIEF DESCRIPTION OF THE DRAWINGS

The invention however, together with additional objects and advantages thereof will be best understood from the following description when read in connection with the accompanying drawings, in which:

FIG. 1 shows a portion of a silicon plate in cross section having mesa structures. The left half of FIG. 1 shows a transistor after vapor deposition but before annealing, while the right half of FIG. 1 shows a transistor after annealing in accordance with the invention.

FIG. 2 shows a corresponding silicon plate having planar structures.

FIG. 3 shows charts comparing the so-called nail-head shearing forces, with and without the EPOS method carried out, for layers of different thickness without annealing.

DETAILED DESCRIPTION OF THE INVENTION

In accordance with the invention, the components, for the purpose of subsequent contacting, are annealed after the application of the silicon layer at a temperature from 480° to 570° C. if the silicon layer is more than about 0.1 μm thick and at a temperature from 400° to 500° C. if the silicon layer is up to about 0.1 μm thick, it being possible to omit the annealing operation if the silicon layer thickness is less than about 0.05 μm. Due to the annealing operation the vapor-deposited silicon on the aluminum film to be contacted diffuses into the latter so that a contactable surface is obtained. The method is applicable to diodes, transistors, thyristors or other silicon components.

The method is preferably executed so that the components with a silicon layer thickness of more than 0.1

μm approximately are annealed at a temperature from 500° to 550° C.; that the components with a silicon layer thickness of up to about 0.1 μm are annealed at a temperature from 420° to 480° C.; that the annealing time is adjusted to range between 10 minutes and 2 hours; and that the operation is carried out in an inert or reducing atmosphere.

It is within the scope of the invention to apply the silicon layer by vapor deposition or sputtering and to apply a polycrystalline silicon layer.

The invention is described in the following in greater detail by way of the Figures. FIG. 1 shows a portion of a silicon plate in cross section, having mesa structures and having been passivated by the method according to the invention. FIG. 2 shows a corresponding silicon plate having planar structures. In FIG. 3 are compared the so-called nailhead shearing forces, with and without the EPOS method carried out, for different layers without annealing.

Shown in FIG. 1, as an example for a silicon component with mesa strucures, in a NPN epibase transistor with EPOS. The left half of FIG. 1 shows a transistor 11 after vapor deposition but before annealing, while the right half of FIG. 1 shows a transistor 12 after annealing. The transistors 11, 12 consist of an N+-substrate 1 and differently doped layers 2, 3 and 7 deposited over the substrate 1, the N-layer 2 representing the collector, the P-layer 3 the base and the N+-layer 7 the emitter of the NPN epibase transistor. The p-n junction between base 3 and emitter 7 is covered on the plate surface by an oxide film 4, such as $SiO_2$. Base 3 and emitter 7 are each contacted by means of aluminum layers 5.

The silicon layer EPOS 6 of a thickness of about 0.1 to 0.4 μm is applied, in particular by vapor-deposition, directly to the entire surface and, hence, also the p-n junction coming to the surface at the mesa edge 8. This also covers the aluminum contacts 5 which usually have a thickness from 0.8 to 6 μm. In this condition the components are not contactable, not even by a gold wire thermo-compression method or an aluminum wire ultrasound bonding method.

Now, it has turned out surprisingly that when the plates are annealed within a temperature range between 480° and 570° C., in particular 500° to 550° C., (hereinafter called EPOS anneal), the silicon on the aluminum layer diffuses into the aluminum layer so that a contactable surface is obtained. It makes little difference whether the aluminum was already alloyed-in or sintered-on in a preceding operation or whether such an operation is carried out simultaneously with the EPOS annealing operation.

This diffusion process is surprising in particular because it has turned out that considerably more silicon can be dissolved in the aluminum than can be expected from the known phase diagram and that, in spite of this, the hardness conditions and other are not so unfavorable as to prevent wire contacting of the aluminum. It has turned out furthermore, that polycrystalline silicon diffuses better than monocrystalline silicon. If the temperature for EPOS thicknesses exceeding 0.1 μm is selected lower than the range indicated, adequate diffusion of the silicon is no longer assured. At temperatures above the range indicated, lateral aluminum secretions will occur in the silicon so that the danger of the occurrence of short circuits is present, especially when the gaps between two aluminum metallizations are narrow.

The transistor 12 shown in the right half of FIG. 1 shows the condition of the EPOS 6 and of the contactable aluminum metallization 5 after annealing. The annealing operation can be carried out either in an inert atmosphere, e.g. in argon, or in a reducing atmosphere, e.g. a gas consisting of nitrogen and 3 to 10% hydrogen. An oxidizing atmosphere is unfavorable because oxide films ($SiO_2$, $Al_2O_3$) will then be generated which prevent diffusion of silicon into aluminum. Using an atmosphere containing hydrogen has the advantage that the $SiO_2$-Si boundary surface properties of the components are not affected negatively, provided such ranges as shown in FIG. 1 are present.

The contactibility of the aluminum surfaces can be determined, for example, by measuring the light reflection of vapor-deposited and non-vapor deposited aluminum surfaces. Highly reflecting surfaces are normally contactable.

According to experience, contactibility is assured if the reflection factor of the vaporized aluminum surface after annealing amounts of 90% of the unvaporized surface.

FIG. 2 shows a cross section of an NPN planar transistor 13 with EPOS 6 without EPOS anneal. The transistor 13 consists of the N-collector layer 2, the P-doped base 3 and the N-doped emitter 7, all disposed over the N+- substrate. The p-n junctions between emitter 7 and base 3 and between base 3 and collector 2 are covered on the surface by an $SiO_2$ film or an $SiO_2/Si_3N_4$ film, respectively. Base 3, emitter 7 and, for example, an additionally provided N+-channel stopper 10 are covered by aluminum layers 5. The aluminum layers 5 usually have a thickness from 0.8 to 2 μm. For shielding or compensation of surface charges, the planar transistor 13 is provided with an EPOS layer 6. To make contactibility of the aluminum surfaces possible, an EPOS annealing operation must also be carried out if the EPOS thicknesses exceed 0.05 μm. For layer thicknesses not exceeding 0.1 μm, the temperature range for the annealing operation is 400° to 500° C., preferably 420° to 480° C. Irrespective of the layer thickness, the annealing time is advantageously selected between 10 minutes and 2 hours because if a shorter time is selected, the diffused silicon amount is too small, and at longer times the stabilizing effect of the EPOS layer may deteriorate. Furthermore, longer annealing times are uneconomical. The choice of the annealing atmosphere is likewise independent of the EPOS thickness.

When components with fine aluminum structures such as RF transistors or components with small distances between the aluminum conductors are involved, short-circuits may be caused due to the EPOS anneal because of the unavoidable lateral aluminum-silicon diffusion. This can be remedied by reducing the EPOS thickness. Now, it has turned out surprisingly that an EPOS annealing operation to diffuse silicon into the aluminum is no longer needed when the EPOS thickness is reduced to less than 0.05 μm. The components are contactable also without additional EPOS anneal.

In FIG. 3 are compared to the so-called nailhead shearing forces of unannealed silicon plates with and without EPOS at EPOS thicknesses of 200, 370 and 690 Å, using a gold wire contacting technology. Nailhead shearing forces are understood to be the forces which must act perpendicularly as a minimum upon a contact wirehead attached to a metallization in order to separate the wire from the metallization. Shown in FIG. 3 are three diagrams for EPOS layer th;cknesses of 200, 370 and 690 Å, their abscissa indicating the nailhead shearing forces in pond and their ordinate the percentage of the contacting connections separated from the metallization at the respective shearing force. The unfilled beams indicate the respective percentage for components without EPOS layer and the filled beams the respective components with EPOS layer. A nailhead shearing force of less than 50 ponds (1 pond=$9.81 \times 10^{-3}$ newton) is commonly considered insufficient. It may be seen from FIG. 3 that partly poor bonds occur only at an EPOS thickness exceeding 0.05 $\mu$m (690 Å), which makes an EPOS anneal at smaller layer thicknesses not absolutely necessary. If other contacting technologies are used, e.g. aluminum wire ultrasound bonding, an EPOS anneal to improve contacting may be advantageous. It was not found that layer thicknesses have an effect on the passivating properties regarding surface ions. The thin layer thickness of 0.04 $\mu$m is particular has an advantageous effect on the parasitic current flow between emitter-base electrodes 5 or base-equipotential area electrodes 5, 9.

Due to the omission of annealing, the aluminum edges are well covered with silicon, which leads to better corrosion resistance in the moisture test. The scratch resistance of the aluminum surface is also improved. EPOS thicknesses thinner than 0.05 $\mu$m can be produced only with vapor-deposited silicon. For example, conventional vacuum vaporizing equipment with a silicon lump as silicon source referred to in German DE-OS No. 27 30 367, may be used. An electron beam may be employed as the energy source. The stabilizing tempering operation described in German DE-OS No. 27 30 367 may, if applicable, be carried out at 280° C., for example after the annealing according to the invention.

The method according to the invention has the advantage that the current-voltage characteristics of components are stabilized on the one hand while the breakdown voltage of the components is increased on the other hand, and if components not yet contacted are used, an etching or masking operation associated with disadvantages is saved, i.e. not employed.

I claim:

1. A passivated aluminum-metalized component with metallic contacts and with a contactable surface for additional metallic contacts without etching comprising an aluminum-metallized silicon component with metallic contacts, a passivating layer obtained by applying a silicon layer having a thickness from about 0.05 $\mu$m to about 0.1 $\mu$m on said silicon component with metallic contacts covering the surface of the component, and annealing at a temperature from 420° to 480° C. to provide a contactable surface for additional metallic contacts with the aluminum of the component without etching to remove the silicon layer, said contactable surface having no other passivating layer deposited thereon.

2. A passivated aluminum-metallized component according to claim 1, wherein the silicon layer is polycrystalline.

3. A passivated aluminum-metallized component with metallic contacts and with a contactable surface for additional metallic contacts without etching comprising an aluminum-metallized silicon component with metallic contacts, a passivating layer obtained by applying a silicon layer having a thickness in excess of about 0.1 $\mu$m on said silicon component with metallic contacts covering the surface of the component, and annealing at a temperature from 500° to 550° C. to provide a contactable surface for additional metallic contacts with the aluminum of the component without etching to remove the silicon layer, said contactable surface having no other passivating layer deposited thereon.

4. A passivated aluminum-metallized component according to claim 3, wherein the silicon layer is polycrystalline.

* * * * *